(12) United States Patent
Katou (10) Patent No.: US 8,264,090 B2
(45) Date of Patent: Sep. 11, 2012

(54) SEMICONDUCTOR DEVICE INCLUDING OFFSET BONDING PAD AND INSPECTION METHOD THEREFOR

(75) Inventor: Tetsuya Katou, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 226 days.

(21) Appl. No.: 12/385,541

(22) Filed: Apr. 10, 2009

(65) Prior Publication Data

US 2009/0273064 A1 Nov. 5, 2009

(30) Foreign Application Priority Data

Apr. 30, 2008 (JP) ................... 2008-118463

(51) Int. Cl.
H01L 23/48 (2006.01)
H01L 23/52 (2006.01)
H01L 29/40 (2006.01)

(52) U.S. Cl. . 257/786; 257/773; 257/784; 257/E23.015; 257/23.02; 257/E21.523

(58) Field of Classification Search ............ 257/773, 257/784, 786, E23.015, E23.02, E21.523
See application file for complete search history.

(56) References Cited

U.S. PATENT DOCUMENTS

| 5,939,780 | A | * | 8/1999 | Inoue | 257/692 |
|---|---|---|---|---|---|
| 6,043,539 | A | * | 3/2000 | Sugasawara | 257/357 |
| 6,130,484 | A | * | 10/2000 | Kameda et al. | 257/786 |
| 6,489,688 | B1 | * | 12/2002 | Baumann et al. | 257/786 |
| 6,730,985 | B2 | * | 5/2004 | Shiina | 257/546 |
| 6,762,507 | B2 | * | 7/2004 | Cheng et al. | 257/786 |
| 6,764,879 | B2 | * | 7/2004 | Nagao et al. | 438/110 |
| 6,784,556 | B2 | * | 8/2004 | Lin | 257/784 |
| 6,847,105 | B2 | * | 1/2005 | Koopmans | 257/686 |
| 7,078,824 | B2 | * | 7/2006 | Shimanuki et al. | 257/786 |
| 2002/0024149 | A1 | * | 2/2002 | Nakamura | 257/786 |
| 2002/0162997 | A1 | * | 11/2002 | Kato | 257/48 |
| 2003/0032263 | A1 | * | 2/2003 | Nagao et al. | 438/462 |
| 2004/0232937 | A1 | | 11/2004 | Ishibashi | |
| 2005/0156165 | A1 | * | 7/2005 | Eldridge et al. | 257/48 |
| 2006/0060965 | A1 | * | 3/2006 | Shimanuki et al. | 257/723 |
| 2006/0279001 | A1 | | 12/2006 | Nishida | |

FOREIGN PATENT DOCUMENTS

| EP | 116927 | A2 | * | 8/1984 |
|---|---|---|---|---|
| JP | 63062368 | A | * | 3/1988 |
| JP | 02102568 | A | * | 4/1990 |

(Continued)

OTHER PUBLICATIONS

Office Action in U.S. Appl. No. 12/929,631 dated Jul. 11 2011.

(Continued)

*Primary Examiner* — Evan Pert
*Assistant Examiner* — Teresa M Arroyo
(74) *Attorney, Agent, or Firm* — McGinn IP Law Group, PLLC (57) ABSTRACT

A semiconductor device includes a circuit block formed in a peripheral edge portion of a semiconductor chip, a circuit block pad formed on the circuit block providing an electrical connection for said circuit block, and a bonding pad laterally offset from the circuit block and the circuit block pad, the bonding pad being electrically connected to the circuit block pad and electrically connected to a lead frame by a bonding wire, the laterally offset bonding pad thereby functioning as a substitute wire bonding pad for the circuit block.

5 Claims, 7 Drawing Sheets

FOREIGN PATENT DOCUMENTS

| | | |
|---|---|---|
| JP | 2000-332206 (A) | 11/2000 |
| JP | 2002-299567 (A) | 10/2002 |
| JP | 2004-363439 | 12/2004 |
| JP | 2006-351588 (A) | 12/2006 |
| JP | 2007-318014 (A) | 12/2007 |
| JP | 2007-335576 (A) | 12/2007 |

OTHER PUBLICATIONS

Notice of Reasons for Rejection dated Mar. 21, 2012, with partial English-language translation.

* cited by examiner

SEMICONDUCTOR DEVICE INCLUDING OFFSET BONDING PAD AND INSPECTION METHOD THEREFOR

BACKGROUND

1. Field of the Invention

The present invention relates to a semiconductor device and an inspection method therefor. In particular, the present invention relates to a semiconductor device including a bonding pad for use in wire bonding, and to an inspection method therefor.

2. Description of Related Art

In general, semiconductor devices are formed in such a manner that a semiconductor chip is mounted on a substrate; a bonding pad formed on the semiconductor chip and a stitch (connection portion) formed on the substrate are connected to each other through a bonding wire such as a gold wire; and then a mold resin is injected into a mold. When each semiconductor device is sealed with the mold resin after the bonding pad and the stitch are connected to each other through the bonding wire, wire sweep, which is a phenomenon that the bonding wire is swept in a direction in which the mold resin flows, may occur due to a pressure of the mold resin, for example.

SUMMARY

In a corner portion of a semiconductor chip, however, a bonding wire extends in an oblique direction with respect to the semiconductor chip under restrictions in regard to a distance between pads. For this reason, wire sweep occurs remarkably in the vicinity of the corner portion of the semiconductor chip. When a large amount of wire sweep occurs, a malfunction occurs in which, for example, bonding wires adjacent to each other are brought into contact with each other, which causes an electrical short-circuit between the bonding wires. In this regard, Japanese Unexamined Patent Application Publication No. 2004-363439 discloses a technology of arranging pads formed in the vicinity of the corner portion, among the bonding pads formed on the semiconductor chip, at a pitch distance proportional to the magnitude of the wire sweep.

Thus, there is a demand to provide a technology capable of preventing a malfunction of a semiconductor device due to wire sweep.

A first exemplary aspect of an embodiment of the present invention is A semiconductor device includes a circuit block formed in a peripheral edge portion of a semiconductor chip, a circuit block pad formed on the circuit block providing an electrical connection for said circuit block, and a bonding pad laterally offset from the circuit block and the circuit block pad, the bonding pad being electrically connected to the circuit block pad and electrically connected to a lead frame by a bonding wire, the laterally offset bonding pad thereby functioning as a substitute wire bonding pad for the circuit block.

When the circuit block pad, which is not to be bonded, is formed in this manner, occurrence of a malfunction due to wire sweep can be prevented. Further, when the circuit block pad and the bonding pad are connected to each other, the circuit block can be formed below the first block, which is not to be bonded, thereby eliminating the need for providing a fill block.

Further, in the semiconductor device, the corner of the semiconductor chip comprises a portion of the peripheral edge portion of the semiconductor chip wherein no circuit blocks are formed, and the laterally offset bonding pad is thereby not formed on a circuit block.

The bonding pad can be disposed on the corner of the semiconductor chip, which results restrain an increasing size of the semiconductor chip.

A second exemplary aspect of an embodiment of the present invention is a method of fabricating a semiconductor device includes the following steps (a)-(d).

(a) forming a circuit block in a peripheral edge portion of a semiconductor chip (b) forming a circuit block pad on the circuit block to provide an electrical interface for the circuit block (c) forming a bonding pad laterally offset from the circuit block and the circuit block pad, the bonding pad being electrically connected to the circuit block pad (d) connecting a bonding wire between the laterally offset bonding pad and a lead frame, the laterally offset bonding pad thereby functioning as a substitute wire bonding pad for the circuit block Accordingly, it is possible to prevent the resin portion for fixing the probe of the probe card from being brought into contact with other pads during an inspection.

A third exemplary aspect of an embodiment of the present invention is a method of reducing a fabrication damage of a semiconductor device. The method includes providing a mechanism to reduce a wire sweep damage, wherein a bonding wire of the semiconductor device is swept in a direction in which a mold resin flows such that one bonding wire contacts another bonding wire or separates from a connection at an end. The mechanism includes forming at least one bonding pad laterally offset from a circuit block pad and electrically connected to the circuit block pad, the laterally offset bonding pad thereby functioning as a substitute wire bonding pad for the circuit block.

According to exemplary embodiments of the present invention, it is possible to provide a semiconductor device capable of preventing occurrence of a malfunction due to wire sweep.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, a semiconductor device according to an exemplary embodiment of the present invention will be described with reference to the accompanying drawings. Note that like components are denoted by like reference numerals, and a description thereof is omitted as appropriate. For ease of explanation, the main portion of the semiconductor device according to an exemplary embodiment of the present invention is enlarged as needed in the drawings.

As a result of an earnest study, the present inventor has found the following fact. That is, when a sealing process is performed using a mold resin in a conventional semiconductor device, such a phenomenon may occur in which local turbulence is generated in a flow of an injected mold resin due to variations in pitch distance between bonding pads, and an uneven stress is applied to the connected bonding wires. In this regard, the present inventor has found it advantageous to provide a non-connected (NC) pad (dummy pad), which is not used for wire bonding, between bonding pads in the vicinity of a corner portion of a semiconductor chip, to thereby arrange the pads at regular intervals.

Figure 1:
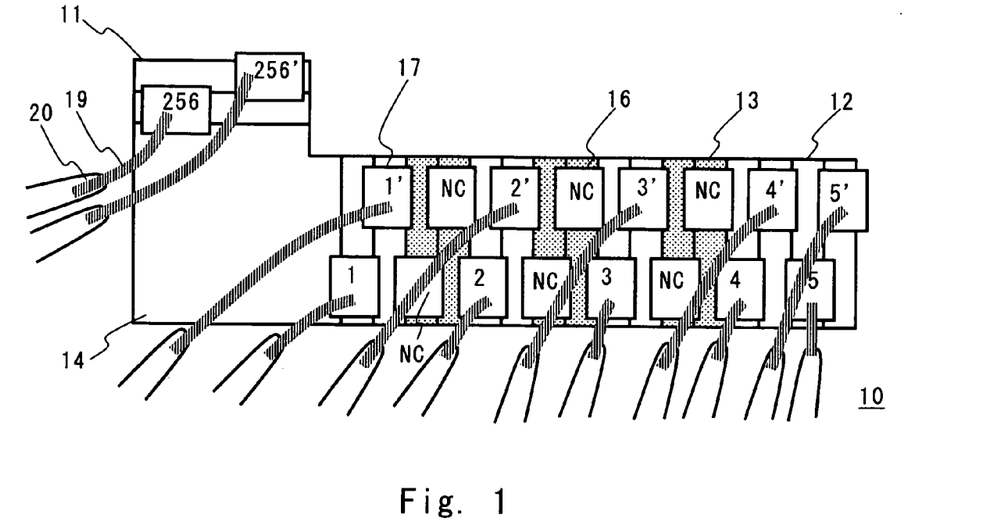
FIG. 1 is a diagram showing a structure of a semiconductor device invented by the present inventor.
Figure 2:
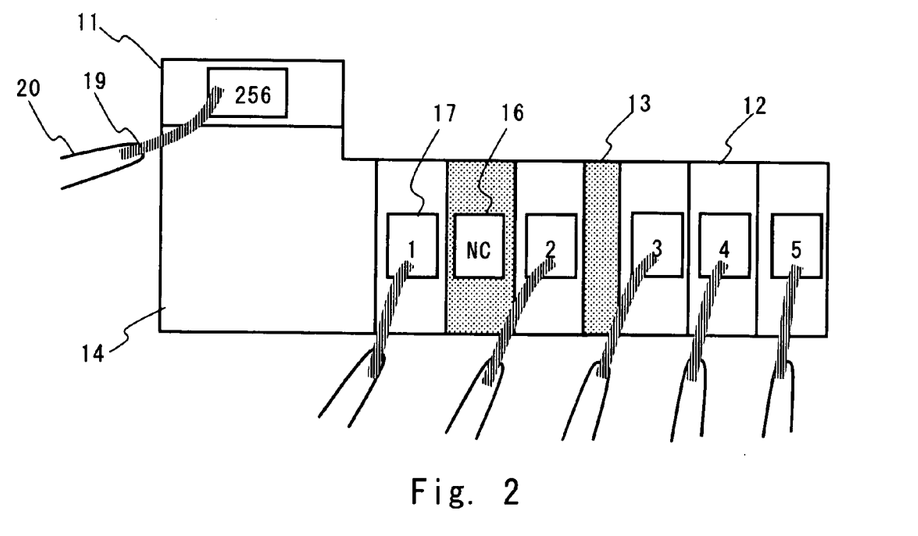
FIG. 2 is a diagram showing another structure of a semiconductor device invented by the present inventor.

FIGS. 1 and 2 each show the structure of the semiconductor device invented by the present inventor. FIG. 1 shows an example in which bonding pads 17 and NC pads 16 are arranged in two rows in a staggered manner in the vicinity of a corner block 14 of a semiconductor chip 11. FIG. 2 shows an example in which the bonding pads 17 and the NC pads 16 are arranged in a row. Referring to FIGS. 1 and 2, in a semiconductor device 10, the bonding pads 17 formed on the semiconductor chip 11 are connected to stitches 20 formed on a lead frame through bonding wires 19 such as gold wires. Though not illustrated in the figures, the semiconductor chip 11, the bonding wires 19, and the like are coated and sealed with a mold resin.

In the vicinity of a corner portion of the semiconductor chip 11, the corner block 14 is formed. The corner block 14 is an area in which circuit blocks 12 and the like are not to be formed within a predetermined distance from the corner portion of the semiconductor chip 11 in order to meet the manufacturing standard. Note that a wire for connecting circuit blocks formed in other areas of the semiconductor chip 11 may be formed in the corner block 14. In a peripheral edge portion of the semiconductor chip 11, the circuit blocks 12 such as an I/O buffer and a power supply circuit are formed.

In the peripheral edge portion of the semiconductor chip 11, a fill block 13 for filling a gap between the circuit blocks 12 is formed between the circuit blocks 12. In the fill block 13, an I/O buffer or the like is not formed, but, for example, a wire for connecting the circuit blocks 12, an ESD protection element, an input buffer for use in testing the semiconductor chip 11, or the like, or a combination thereof is formed. The circuit blocks 12 and the fill blocks 13 are arranged over the peripheral edge portion of the semiconductor chip 11.

The bonding pad 17 is formed on each of the circuit blocks 12. The bonding pad 17 is connected with the bonding wire 19. Further, the NC pad 16 is formed on each of the fill blocks 13. The NC pad 16 serves as a dummy pad which is not used for bonding. The NC pad 16, which is not used for bonding, is disposed between the bonding pads 17 in the vicinity of the corner block 14 in the manner as described above, thereby preventing occurrence of a malfunction due to wire sweep.

In the semiconductor device 10 shown in FIG. 1, the NC pads 16 and the bonding pads 17 are alternately arranged in each of an outermost first pad row and a second pad row positioned inside the first pad row, in the vicinity of the corner block 14. Further, the NC pads 16 and the bonding pads 17 of the two rows are arranged in a staggered manner so that each of the NC pads 16 and the bonding pads 17 of the first pad row and each of the NC pads 16 and the bonding pads 17 of the second pad row are not formed in the same block. In each row, the NC pads 16 and the bonding pads 17 are formed at substantially the same pitch. As a result, local turbulence generated in a flow of an injected mold resin can be suppressed, and a malfunction occurring in the connected bonding wires can be eliminated.

In the semiconductor device 10 shown in FIG. 2, the bonding pads 17 and the NC pads 16 are alternately arranged in the vicinity of the corner block 14. Note that an area formed between the bonding pads 17(2) and 17(3) has a smaller width than each of the fill block 13 on which the NC pad 16 is formed and the circuit block 12 on which the bonding pad 17 is formed. That is, referring to FIGS. 1-6, semiconductor chip 11 may exemplarily include bonding pads 17(1) to 17(256). In additional embodiments, semiconductor chip 11 may exemplarily include bonding pads 17(1') to 17(256'). In this area, the NC pad 16 is not formed, and only the fill block 13 is formed. In an area other than the vicinity of the corner block 14, that is, in a central portion of the peripheral edge portion of the semiconductor chip 11, the fill block 13 is not formed, but the circuit blocks 12 are arranged over the area. Further, the bonding pad 17 is formed on each of the circuit blocks 12.

Meanwhile, the semiconductor device invented by the present inventor has such a problem that the size of the semiconductor chip is increased due to formation of the NC pads 16. Specifically, in the semiconductor device 10 shown in FIG. 1, two NC pads 16 are formed in the vicinity of the corner block 14 on one side. Thus, on one side of the semiconductor chip 11, the chip size is increased by an amount corresponding to four NC pads 16. In the semiconductor device 10 shown in FIG. 2, a single NC pad 16 is formed in the vicinity of the corner block 14 on one side. Thus, on one side of the semiconductor chip 11, the chip size is increased by an amount corresponding to two NC pads 16. Therefore, the present inventor has devised a technique for reducing the size of the area in which the NC pad 16 is formed and which is not able to use for forming a signal input/output circuit, a power supply circuit, or the like, to thereby reduce the size of the semiconductor chip.

Figure 3:
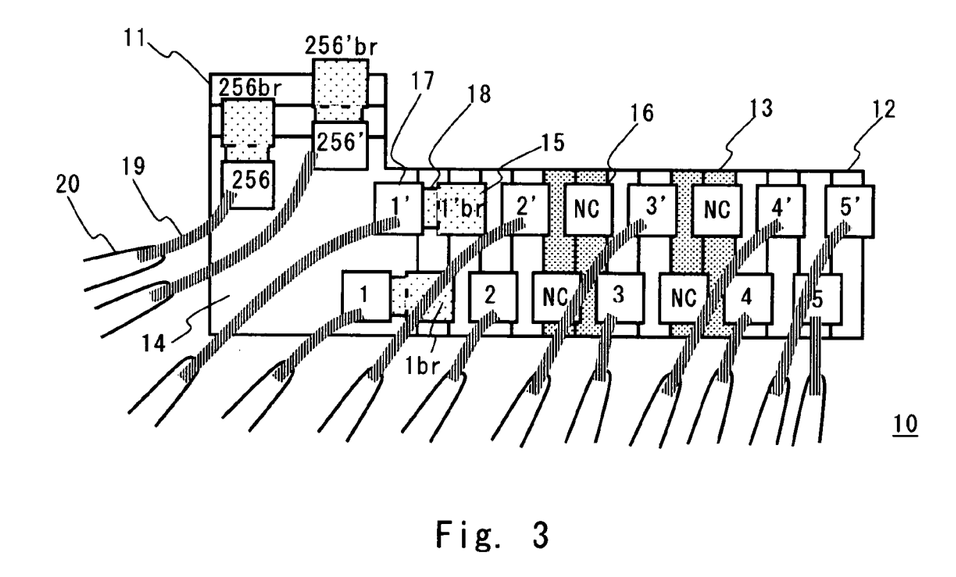
FIG. 3 is a plan view showing a structure of a semiconductor device according to an exemplary embodiment of the present invention.

Referring now to FIG. 3, the structure of the semiconductor device according to an exemplary embodiment of the present invention is described. FIG. 3 is a plan view showing the structure of the semiconductor device according to an exemplary embodiment of the present invention. As shown in FIG. 3, the semiconductor device 10 includes the semiconductor chip 11, the circuit blocks 12, the fill blocks 13, the corner block 14, connection pads 15, the NC pads 16, the bonding pads 17, pad bridges 18, the bonding wires 19, and the stitches 20. As described above, in the semiconductor device 10 according to an exemplary embodiment of the present invention, the bonding pads 17 formed on the semiconductor chip 11 and the stitches 20 formed on the lead frame are connected to each other through the bonding wires 19 such as gold wires.

Though not illustrated in the figure, the semiconductor chip 11, the bonding wires 19, and the like are coated and sealed with a mold resin.

In the semiconductor device 10 shown in FIG. 3, two pad rows are formed along each edge side of the semiconductor chip 11. In the outermost first pad row, the connection pad (circuit block pad) 15(1*br*) is formed in the vicinity of the corner block 14 located at the corner portion of the semiconductor chip 11. The connection pad 15(1*br*) is a pad which is not used for bonding. That is, referring to FIGS. 3-5, semiconductor chip 11 may exemplarily include bonding pads 15(1*br*) to 15(256*br*). In additional embodiments, semiconductor chip 11 may exemplarily include bonding pads 15(1'*br*) to 15(256'*br*). The connection pad 15(1*br*) is electrically connected with the bonding pad 17(1) through the pad bridge 18. The bonding pad 17(1) is connected with the bonding wire 19 to be connected to the stitch 20. That is, the bonding pad 17(1) laterally offset from the circuit block 12 and the connection pad 15(1*br*). The bonding pad 17(1) is electrically connected to the connection pad 15(1*br*). The bonding pad 17(1) is also electrically connected to the stitch 20 by a bonding wire. The bonding pad 17(1) is laterally offset from the connection pad 15(1*br*) in a direction of a nearest corner of the semiconductor chip. The laterally offset bonding pad thereby functions as a substitute wire bonding pad for the circuit block.

The connection pad 15(1*br*) and the bonding pad 17(1) have substantially the same shape. The bonding pad 17(1) is formed on the corner block 14. Specifically, the bonding pad 17(1) is formed by being protruded from the circuit blocks 12 that are arranged over the peripheral edge portion of the semiconductor chip 11.

Also in the second pad row positioned inside the outermost first pad row, the connection pad 15(1'*br*) is formed in the vicinity of the corner block 14 located at the corner portion of the semiconductor chip 11. The connection pad 15(1'*br*) is a pad which is not used for bonding. The connection pad 15(1'*br*) is electrically connected with the bonding pad 17(1') through the pad bridge 18. The connection pad 15 (1'*br*) and the bonding pad 17(1') have substantially the same shape. The bonding pad 17(1') is connected with the bonding wire 19 to be connected to the stitch 20. The bonding pad 17(1') is formed on the corner block 14. Specifically, the bonding pad 17(1') is formed by being protruded from the circuit blocks 12 that are arranged over the peripheral edge portion of the semiconductor chip 11. The circuit block 12 comprises a first circuit block of a plurality of circuit blocks formed in the peripheral edge portion of the semiconductor chip, each circuit block of the plurality of circuit blocks other than the first circuit block having a connection pad formed thereon with a bonding wire attached thereto.

Furthermore, the corner of the semiconductor chip (corner block 14) comprises a portion of the peripheral edge portion of the semiconductor chip wherein no circuit blocks are formed, and the laterally offset bonding pad is thereby not formed on a circuit block. The laterally offset bonding pad comprises at least part of a mechanism for reducing a malfunction of the semiconductor device due to a wire sweep during fabrication of the semiconductor device. A bonding wire of the semiconductor device is swept in a direction in which a mold resin flows such that one bonding wire contacts another bonding wire or separates from a connection at an end. The NC pads 16 are formed at positions farther from the corner block 14 than the connection pad 15 in the vicinity of the corner portion of the semiconductor chip 11. The fill blocks 13 are formed below the NC pads 16. In the outermost first pad row, the bonding pads 17(2, 3, 4) and the NC pads 16 are alternately arranged. In the second pad row positioned inside the first pad row, the bonding pads 17(2', 3', 4') and the NC pads 16 are alternately arranged. The NC pads 16 and the bonding pads 17 of the two rows are arranged in a staggered manner so that each of the NC pads 16 and the bonding pads 17 of the first pad row and each of the NC pads 16 and the bonding pads 17 of the second pad row are not formed in the same block. In each row, the NC pads 16 and the bonding pads 17 are formed at substantially the same pitch.

Figure 4A:
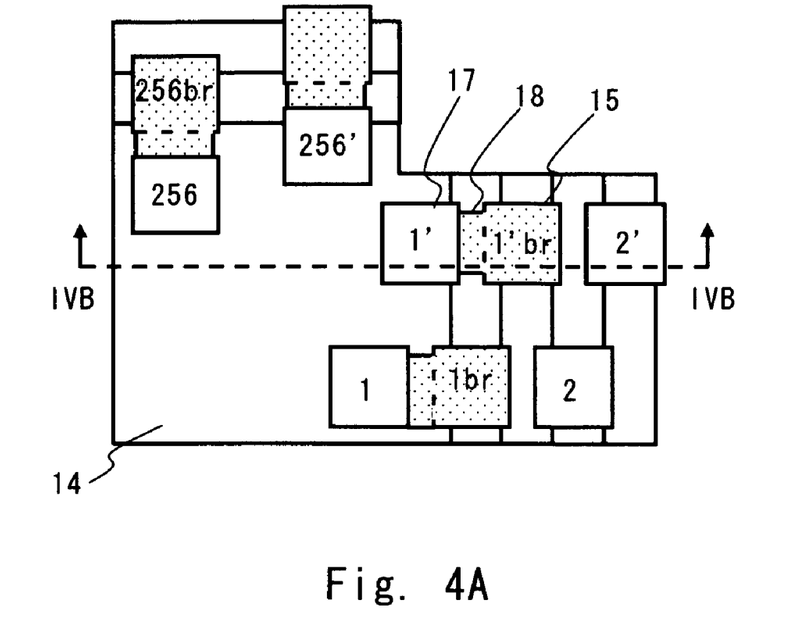
FIGS. 4A and 4B are diagrams each showing a structure of a semiconductor chip according to an exemplary embodiment of the present invention.
Figure 4B:
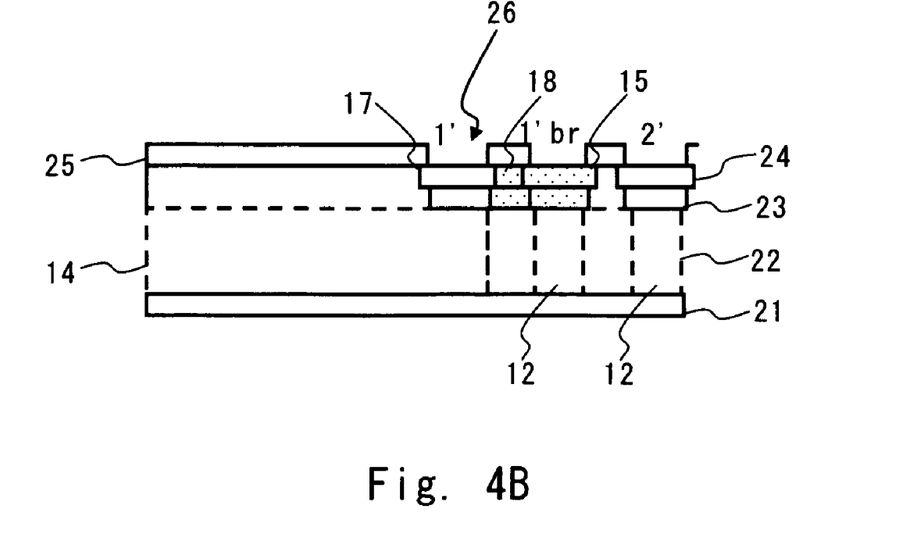

FIGS. 4A and 4B each show the structure of the main part of the semiconductor chip 11 shown in FIG. 3. FIG. 4A is a plan view of the semiconductor chip 11, and FIG. 4B is a cross-sectional view of the semiconductor chip 11 taken along the line IVB-IVB of FIG. 4A. As shown in FIGS. 4A and 4B, the circuit blocks 12 are formed on a substrate 21. Note that, though not illustrated in FIGS. 4A and 4B, the fill block 13 is formed between the circuit blocks 12 at a position farther from the corner portion of the semiconductor chip 11 than the connection pad 15(1'). Referring to FIG. 4B, the circuit blocks 12 and the fill blocks 13 are illustrated as a lower layer 22.

The circuit blocks 12 are formed below the connection pad 15 (1'*br*) and the bonding pad 17(2'), respectively. The circuit blocks 12 are connected to the connection pad 15(1'*br*) and the bonding pad 17(2'), respectively, through a VIA layer 23. The connection pad 15(1'*br*) and the bonding pads 17(1', 2') are each formed of an uppermost layer 24 such as Al. Further, the circuit block 12 formed below the connection pad 15(1'*br*) is connected to the bonding pad 17(1') through the connection pad 15(1'*br*). The bonding pad 17(1') is formed on the corner block 14.

On the uppermost layer 24, an insulating layer 25 made of polyimide or the like is formed. In the insulating layer 25, openings 26 are formed at positions corresponding to the bonding pads 17, the connection pads 15, and the NC pads 16. Specifically, the connection pads 15, the NC pads 16, and the bonding pads 17 are formed in areas of the insulating layer 25, in which the openings 26 are formed.

The connection pads 15 and the NC pads 16, which are not used for bonding, are formed in this manner, thereby preventing the malfunction due to wire sweep. Further, the connection pads 15(1*br*, 1'*br*) and the bonding pads 17(1, 1') are respectively connected to each other in each pad row of the semiconductor chip 11. As a result, the areas in which the NC pad 16 is formed and the fill block 13 is formed below the NC pad 16 can be omitted. Specifically, the fill blocks 13 formed between the bonding pads 17(1) and 17(2) and the fill blocks 13 formed between the bonding pads 17(1') and 17(2') as shown in FIG. 1 can be omitted. In other words, two fill blocks 13 can be omitted in the vicinity of the corner block 14 on one side, and four fill blocks 13 can be omitted on one side of the semiconductor chip 11. As a result, the reduction in size of the semiconductor chip 11 can be attained.

Figure 5:
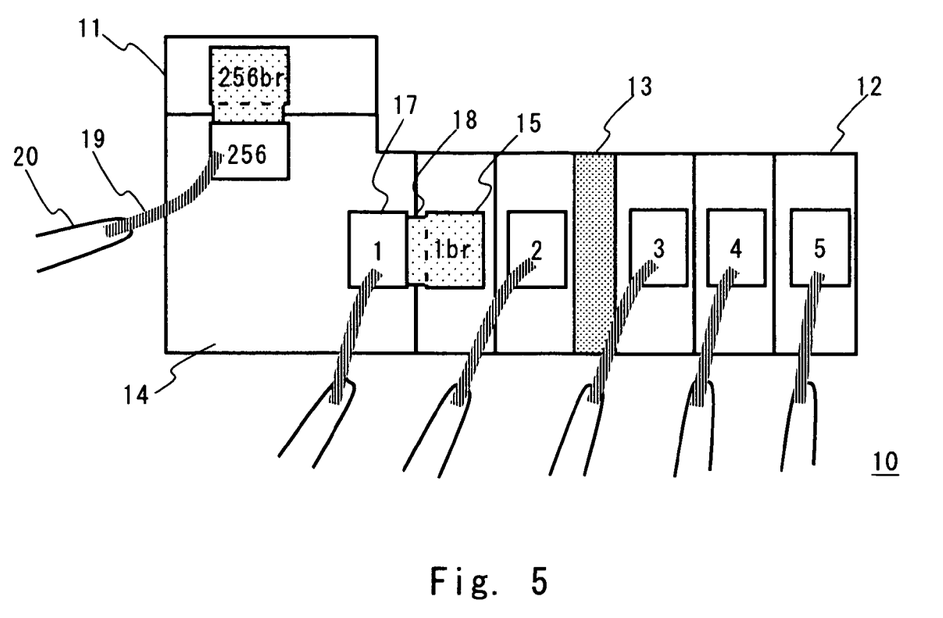
FIG. 5 is a plan view showing another structure of a semiconductor device according to an exemplary embodiment of the present invention.

FIG. 5 shows another structure of the semiconductor device 10 according to an exemplary embodiment of the present invention. The semiconductor device 10 shown in FIG. 5 is an example in which the bonding pads 17 are arranged in a row. Referring to FIG. 5, the connection pad 15(1*br*) is formed in the vicinity of the corner block 14 located at the corner portion of the semiconductor chip 11. The connection pad 15(1*br*) is not used for bonding. The connection pad 15(1*br*) is electrically connected with the bonding pad 17(1) through the pad bridge 18. The connection pad 15(1*br*) and the bonding pad 17(1) have substantially the same shape. The bonding pad 17(1) is formed at a position nearest to the corner block 14 in the pad row. The bonding pad 17(1) is connected with the bonding wire 19 to be connected to the stitch 20. The bonding pad 17(1) is formed on the corner block 14.

An area formed between the bonding pads 17(2) and 17(3) has a smaller width than each of the circuit blocks 12 on which the bonding pad 17 is formed. In this area, the NC pad 16 is not formed, and only the fill block 13 is formed.

Also in the semiconductor device 10 shown in FIG. 5, the connection pad 15 and the fill block 13, which are not used for bonding, are formed, thereby preventing occurrence of the malfunction due to wire sweep. Further, since the connection pad 15(1br) and the bonding pad 17(1) are connected to each other, the area in which the NC pad 16 is formed and the fill block 13 is formed below the NC pad 16 can be omitted. Specifically, the fill block 13 formed between the bonding pads 17(1) and 17(2) as shown in FIG. 2 can be omitted. In other words, a single fill block 13 can be omitted in the vicinity of the corner block 14 on one side, and two fill blocks 13 can be omitted on one side of the semiconductor chip 11. As a result, the reduction in size of the semiconductor chip 11 can be attained.

Figure 6:
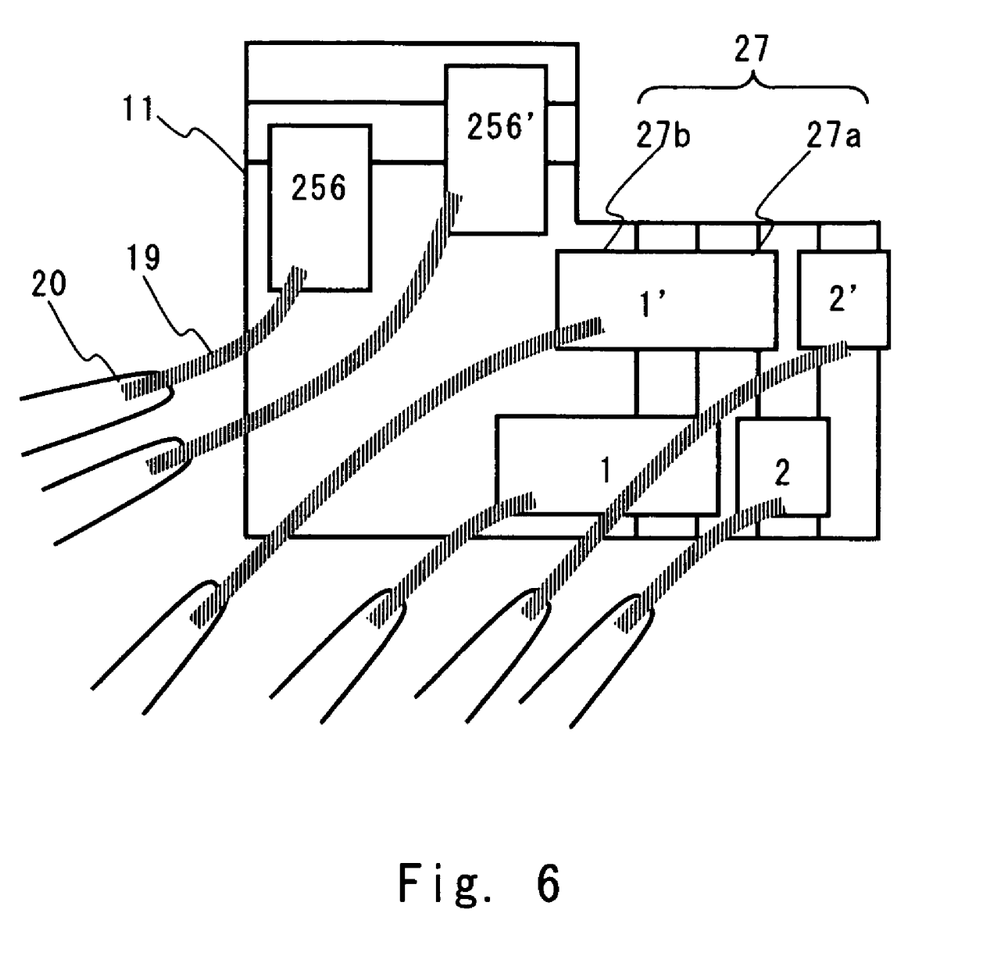
FIG. 6 is a plan view showing still another structure of a semiconductor device according to an exemplary embodiment of the present invention.

Further, FIG. 6 shows still another structure of the semiconductor device 10 according to an exemplary embodiment of the present invention. The semiconductor device 10 shown in FIG. 6 is an example in which the bonding pads 17 and the NC pads 16 are arranged in two rows in a staggered manner as in FIG. 3. Unlike the structure shown in FIG. 3, in the semiconductor device 10 shown in FIG. 6, the connection pad 15(1br) and the bonding pad 17(1) shown in FIG. 3 are formed of a single dual-purpose pad 27. Specifically, the dual-purpose pad 27 includes a connecting portion 27a formed on the circuit block 12 and a bonding portion 27b to be bonded. The bonding portion 27b formed as a part of the dual-purpose pad 27 is protruded on the corner block 14. The dual-purpose pad 27 is larger than the bonding pad 17 and the NC pad 16 which are formed on the peripheral edge portion of the semiconductor chip. Also in the structure, the malfunction due to wire sweep can be prevented and the size of the semiconductor chip can be reduced in the same manner as described above.

Figure 7:
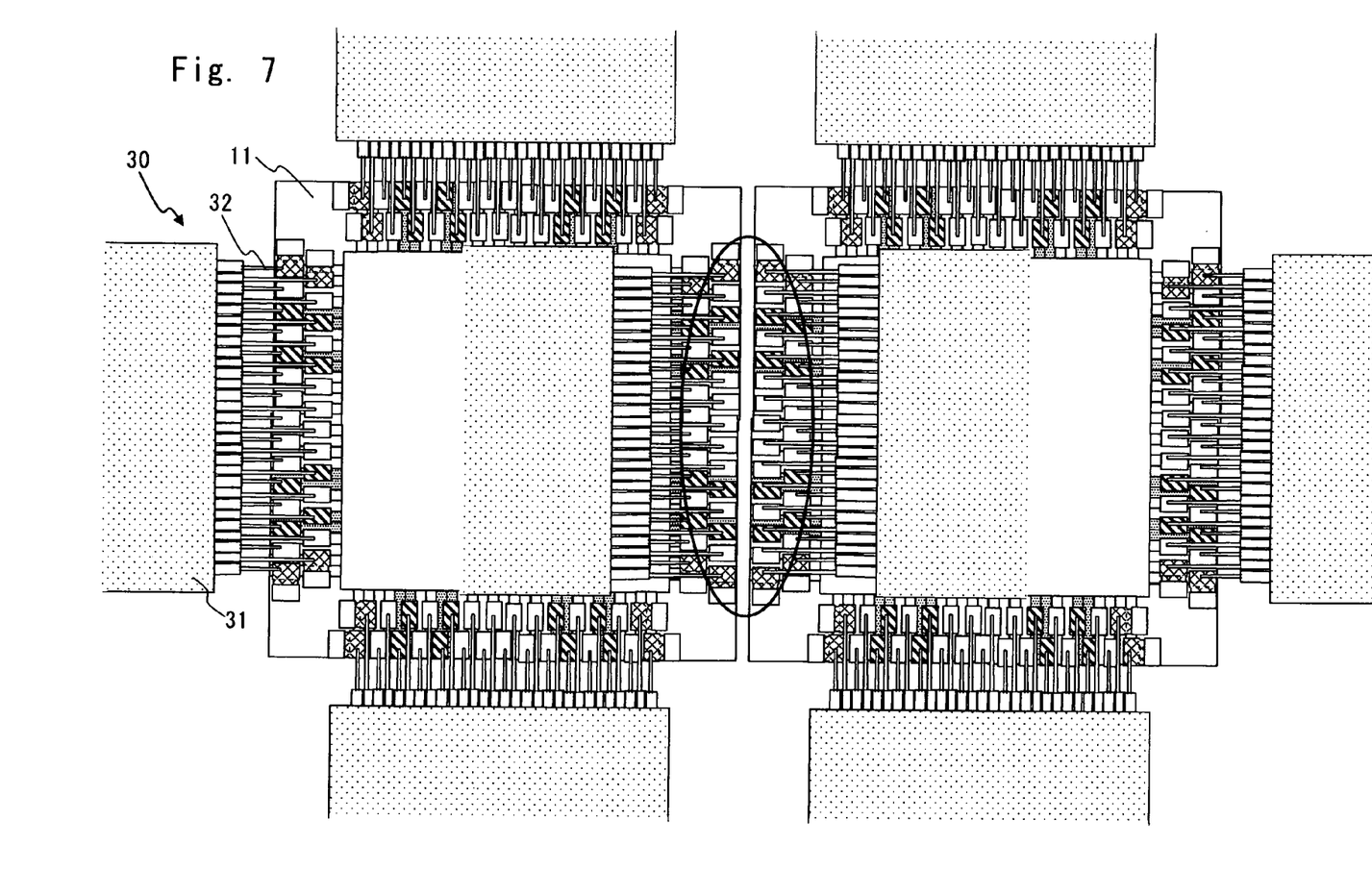
FIG. 7 is a diagram showing a state in which the semiconductor device according to an exemplary embodiment of the present invention is inspected using a probing technique.
Figure 8:
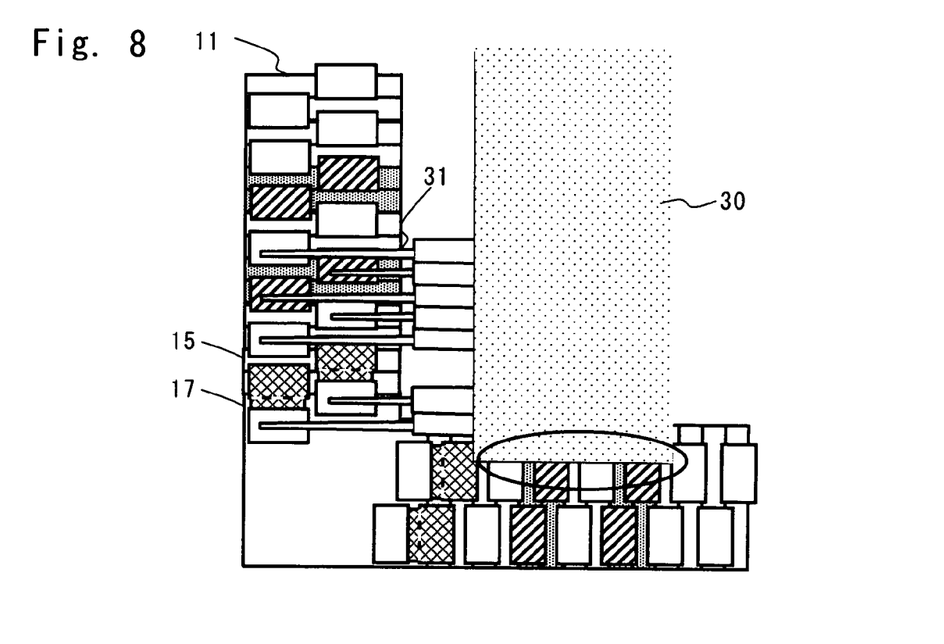
FIG. 8 is a diagram illustrating a state where probes and pads are in contact with each other when adjacent portions of semiconductor chips are inspected using the probing technique in FIG. 6.
Figure 9:
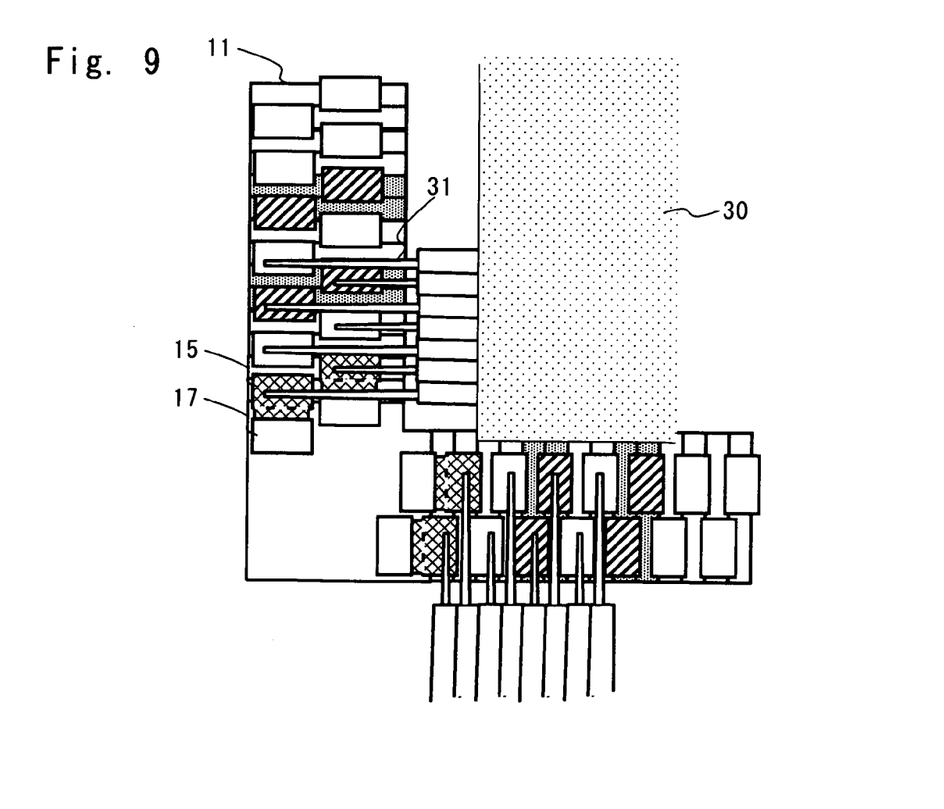
FIG. 9 is a diagram illustrating a state where the probes and pads are in contact with each other when the adjacent portions of the semiconductor chips are inspected using the probing technique in FIG. 6.

Referring next to FIGS. 7 to 9, a method of inspecting the semiconductor device 10 will be described. FIG. 7 is a diagram showing a state where the semiconductor device according to an exemplary embodiment of the present invention is inspected using a probing technique. FIGS. 8 and 9 are diagrams each illustrating a state where probes and pads are in contact with each other when adjacent portions of the semiconductor chips 11 are inspected using the probing technique in FIG. 6. Note that FIG. 7 shows an example in which two semiconductor chips 11 of FIG. 3 are arranged so as to be adjacent to each other and the two semiconductor chips 11 are inspected at the same time.

As shown in FIG. 7, the semiconductor chips 11 are inspected using a probe card 30. The probe card 30 includes resin portions 31 for fixing a plurality of probes 32, and the plurality of probes 32. The plurality of probes 32 are fixed to the resin portions 31. The probes 32 are arranged so as to correspond to the pads (connection pads 15, the NC pads 16, and the bonding pads 17) of the semiconductor chip 11. Though not illustrated in the figure, the probe card 30 is connected to an external tester. During the inspection of the semiconductor chips 11, an inspection signal is supplied to each of the pads from the external tester with the probes 32 being in contact with the pads.

When the probes 32 are brought into contact with the pads, which are formed on the upper, lower, and left sides of the semiconductor chip 11 disposed on the left side of FIG. 7, and the pads, which are formed on the upper, lower, and right sides of the semiconductor chip 11 disposed on the right side of FIG. 7, the resin portions 31 are disposed outside the semiconductor chips 11. On the other hand, when the probes 32 are brought into contact with the adjacent portions of the semiconductor chips 11, that is, the pads, which are formed on the right side of the semiconductor chip 11 disposed on the left side of FIG. 7, and the pads, which are formed on the left side of the semiconductor chip 11 disposed on the right side of FIG. 7, the resin portions 31 are disposed on the upper side of the semiconductor chips 11.

Referring now to FIGS. 8 and 9, a description is given of a state where the probes and the pads are in contact with each other when the adjacent portions of the semiconductor chips 11 are inspected using the probing technique. As shown in FIG. 8, when the probes 32 formed at the outermost end of the probe card 30 are brought into contact with the bonding pads 17 formed at the outermost end of the pad row, which are disposed on the left side of the semiconductor chip 11, the resin portion 31 is brought into contact with the pads formed on the lower side of the semiconductor chip 11. For this reason, according to an exemplary embodiment of the present invention, the probes 32 are brought into contact with the connection pads 15 connected to the bonding pads 17, which are formed at the outermost end of the pad rows disposed on the left side of the semiconductor chip 11, through the pad bridges 18 as shown in FIG. 9. Likewise, also on the upper side of the semiconductor chip 11, the probes 32 are brought into contact with the connection pads 15. As a result, the inspection can be performed while preventing the resin portion 31 from being brought into contact with the pads formed on the upper and lower sides of the semiconductor chip 11.

As described above, according to an exemplary embodiment of the present invention, even in the case where the wire sweep occurs when the semiconductor chip is molded with a resin after the bonding pads and the stitches are connected to each other through the bonding wires, occurrence of a malfunction can be prevented. Further, in each pad row of the semiconductor chip 11, the bonding pad 17 formed at the outermost end and the connection pad 15 are connected to each other, and the bonding pad 17 formed at the outermost end is protruded on the corner block 14. As a result, the size of the semiconductor chip 11 can be reduced, which enables miniaturization of the entire device.

Moreover, when a plurality of semiconductor chips 11 are subjected to probing at the same time, among the bonding pads 17 and the connection pads 15, which are connected to each other through the pad bridge 18, the probes 32 are brought into contact with the connection pads 15 which are not wire-bonded. Therefore, the semiconductor chips 11 can be inspected while preventing the resin portions 31 from being brought into contact with the pads formed on the other sides of the semiconductor chip 11.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device, comprising:
a plurality of circuit blocks, a circuit block of the plurality of circuit blocks being formed in a peripheral edge portion of a semiconductor chip;
a circuit block pad formed on the circuit block providing an electrical connection for the circuit block;
at least one fill block to fill in a gap between two adjacent circuit blocks of the plurality of circuit blocks; and
a bonding pad laterally offset from the circuit block and the circuit block pad, the bonding pad being electrically connected to the circuit block pad and serving as a bonding wire pad for the circuit block, the laterally offset bonding pad thereby functioning as a substitute wire bonding pad for the circuit block,
wherein the bonding pad is laterally offset from the circuit block pad in a direction of a nearest corner of the semiconductor chip,
wherein the corner of the semiconductor chip comprises a portion of the peripheral edge portion of the semiconductor chip wherein no circuit blocks are formed, and the laterally offset bonding pad is thereby not formed on a circuit block,
wherein the plurality of circuit blocks are formed in the peripheral edge portion of the semiconductor chip,
wherein circuit blocks of the plurality of circuit blocks not adjacent to the corner of the semiconductor chip include a circuit block pad formed thereon that does not have an associated laterally offset bonding pad, and
wherein each fill block is formed at a position farther away from a corner of the semiconductor chip than the circuit block.

2. The semiconductor device of claim 1, further comprising a bonding wire attached to the laterally offset bonding pad.

3. The semiconductor device of claim 1, wherein each fill block having a bonding pad thereon when a width of the fill block is sufficiently large to accommodate a bonding pad,
wherein each fill block is formed without a bonding wire attached thereto.

4. The semiconductor device of claim 3, wherein each fill block thereby serves to maintain a substantially constant distance between respective bonding pads.

5. The semiconductor device of claim 3, wherein the at least one fill block comprises one of an electrostatic discharge (ESD) protection element, a wire, and an input buffer for a testing signal.

* * * * *